US007780135B2

(12) United States Patent
Nelson et al.

(10) Patent No.: US 7,780,135 B2
(45) Date of Patent: Aug. 24, 2010

(54) SPEAKER MOUNTING SYSTEM

(75) Inventors: Thomas Nelson, West Milford, NJ (US); Ernest Ketterer, Kinnelon, NJ (US)

(73) Assignee: Bogen Communications Inc., Ramsey, NJ (US)

( * ) Notice: Subject to any disclaimer, the term of this patent is extended or adjusted under 35 U.S.C. 154(b) by 0 days.

(21) Appl. No.: 12/317,626

(22) Filed: Dec. 24, 2008

(65) Prior Publication Data

US 2010/0155556 A1 Jun. 24, 2010

(51) Int. Cl.
*B42F 13/00* (2006.01)
*F21V 15/00* (2006.01)
*H05K 5/00* (2006.01)

(52) U.S. Cl. ..................... 248/342; 248/27.1; 248/27.3; 248/231.9; 248/916; 181/150; 381/386; 362/365

(58) Field of Classification Search ................. 248/342, 248/27.1, 343, 231.9, 231.91, 916, 27.3; 181/150; 381/182, 387, 386; 362/365, 366
See application file for complete search history.

(56) References Cited

U.S. PATENT DOCUMENTS 4,048,491 A * 9/1977 Wessman .................... 362/364
5,077,650 A * 12/1991 Cestari ....................... 362/365
5,331,119 A * 7/1994 Leger et al. ................. 181/150
5,964,523 A * 10/1999 Eversberg ................... 362/365
6,101,262 A * 8/2000 Haase et al. ................ 381/386
6,588,543 B1 * 7/2003 Tchilinguirian ............. 181/150
7,334,767 B2 * 2/2008 Wright ....................... 248/342
7,676,045 B2 * 3/2010 Merrey et al. ................. 381/87
7,731,130 B2 * 6/2010 Decanio et al. ............ 248/27.3

* cited by examiner

*Primary Examiner*—Anita M King
(74) *Attorney, Agent, or Firm*—Collard & Roe, P.C.

(57) ABSTRACT

A system for mounting a component in an aperture of a supporting surface has a mounting flange surrounding the component to be mounted, and at least two clamp dogs attached to the mounting flange and located adjacent a rear surface of the mounting flange. The component is inserted into a mounting hole cut in a sheet rock surface or ceiling tile, so that the flange abuts the front face of the surface. The clamping assemblies are located on the rear face of the surface. There is a pivoting system for pivoting the clamp dog around an axis. The pivoting system is operable from both the front surface and the rear surface of the mounting flange so that the clamp dogs can be actuated from either side of the sheet rock or ceiling tile.

9 Claims, 9 Drawing Sheets

SPEAKER MOUNTING SYSTEM

BACKGROUND OF THE INVENTION

1. Field of the Invention

The present invention relates to a speaker mounting system that eliminates the need for a tile bridge.

2. The Prior Art

High quality speakers designed for mounting in suspended ceilings commonly comprise a front bezel and grill and have a back-can that fully encloses all the parts of the speaker assembly. The back-can, in addition to its acoustic purpose, protects the speaker and other components from dust and damage as well as often acting as a fire block. Back-cans are typical but not always required. Mounting these types of speakers in a suspended ceiling tile usually requires an additional bracket, commonly referred to as a tile bridge, to transfer the speaker's weight onto the suspended ceiling grid structure and off of the non-load bearing ceiling tiles. A tile bridge is required to rigidly span the entire width of the ceiling tile. The typical tile bridge has two structural rails to span the tile width and a sheet metal deck fastened between the rails and having a central hole larger than the diameter of the speaker to be supported. A very common ceiling tile width is 24".

It is often desirable for the manufacturer to supply the tile bridge with the speaker product. However, including the tile bridge along with the speaker presents some packaging challenges due to the 24" length of the tile bridge. Typically, the speaker being supported is much smaller in all dimensions than the tile bridge. This leads to excessive unused space in the box of a speaker packaged to include the tile bridge. This excessive space affects the cost of shipping and warehousing as well cost of the product itself. To avoid the problem of excessive empty space, many manufacturers will sell the speakers in sets of two, so the combined package dimensions are more accommodating of the 24" tile bridge. Obviously, this is not an optimum situation, especially for speakers that may not be used in pairs. Tile bridges are typically made of formed sheet metal or extruded aluminum pieces because of their necessary rigidity. The cost of these raw materials and the quantities in which they are used in a tile bridge significantly increases the cost of the product. The costs and difficulties of packaging the speaker and tile bridge are clear.

High quality speakers designed for mounting in suspended ceiling commonly use an integral clamping system, and when installed in the ceiling, only the front bezel and grille of the speaker are visible, with the back-can enclosure, if included, protruding into the void behind the suspended ceiling. The integral clamping system typically pinches the ceiling tile and tile bridge between the speaker's front bezel and several movable clamping arms or clamp dogs. The actuator which moves the clamp dog is typically a screw that is operated from the front of the speaker. The location of the head of the screw actuator on the front of the speaker leads to some difficulties when assembling the speaker, ceiling tile and tile bridge together. It is quite common when installing speakers in suspended ceilings to remove the ceiling tile, modify and assemble it with the speaker and tile bridge and then return it to its place in the ceiling grid. In this type of assembly process, the ceiling tile and tile bridge are slipped over the rear of the speaker with the speaker facing down, but actuation of the clamp dogs must be done from the front of the speaker. This leads to assembly difficulties since to actuate the screws, the assembly must be turned so the speaker is facing up, but then the ceiling tile and tile bridge fall away from the speaker since they slide on from the back. Obviously some type of fixture to keep all of the components together while actuating the screws must be used to assist in the assembly. A simple drum or garbage can will suffice, but the alignment of the tile bridge with the ceiling is now obscured. It is clear that this method of assembly is inefficient and difficult. Many ceiling speakers may be used in a single installation, which only compounds the inefficiency of this method.

Along with suspended ceilings, these types of high quality speakers with integral clamping systems can be used in hard surfaced wall coverings like wallboard. With this type of material, the speaker is loaded into a hole cut into the ceiling and then the clamp dogs are actuated. Often, no tile bridge or other type of support is needed in this type of installation, due to the inherent strength of the wallboard material. This type of installation is often done blind since the actions of the clamp dogs cannot be observed. To install the speaker through its mounting hole, the clamp dogs must rotate back toward the center of the speaker or the speaker's back-can to avoid interfering with fitting the speaker through its hole. The clamp dogs must then reliably rotate out to overhang the hole edge to allow them to clamp to the wall board. If the speaker needs to be removed, the clamp dogs must reliably rotate back towards the back-can when the clamp dogs are loosened. When removing a speaker like this, it is not uncommon for the installer to overly loosen the clamp dogs, since visibility is impaired. This can cause the clamp dog to unscrew from the screw actuator and fall off completely. Depending on the construction of the clamp and actuator, this may permanently damage the speaker's clamping system. At the very least, this action is annoying and can lead to losing a critical part of the speaker's clamping system.

SUMMARY OF THE INVENTION

It is therefore an object of the invention to integrate a compact tile bridge with the speaker, provide an ability to operate a clamping mechanism from the front or rear, and provide a mechanism consisting of captive parts that cannot be accidentally disassembled. The system is also designed to operate in wallboard on 16" or wider centered framing as well as bridging across 24" ceiling tiles.

The system according to the invention comprises a mounting flange surrounding a component such as a speaker to be mounted, and at least two clamping assemblies attached to the rear surface of the mounting flange. The component is inserted into a mounting hole cut in a sheet rock surface or ceiling tile, so that the flange abuts the front face of the surface. The clamping assemblies are then located on the rear face of the surface. Each clamping assembly comprises an elongated clamp dog and a pivoting system for pivoting the clamp dog around an axis. The pivoting system is operable from both the front surface and the rear surface of the mounting flange so that the clamp dogs can be actuated from either side of the sheet rock or ceiling tile.

The pivoting system allows the clamp dogs to be pivoted between a retracted and extended position, such that in the retracted position, the clamp dog is located within a radius of the mounting flange so that the component can be inserted through as small a hole as possible. When the clamp dog is pivoted into the extended position, the clamp dog extends beyond a radius of the mounting flange to support the speaker system on the sheet rock or ceiling tile and clamp the mounting flange to the sheet rock or ceiling tile. The clamp dogs can be made of various lengths, depending on the required use. For use in a ceiling tile, the clamp dogs should be constructed long enough so that they span the entire width of the ceiling tile when extended, so that they can support the speaker or other component on the ceiling grid.

The pivoting system preferably comprises a screw extending through the clamp dog. The screw can then be turned from either side of the mounting flange. In one embodiment, the screw has a screw head accessible from the front surface of the mounting flange, and a cap mounted on the opposite end of the screw. The screw can be turned by a screwdriver on the front surface of the flange, and can be turned via a screwdriver or manually on the rear surface via the cap. In this situation, the cap is equipped with a screw slot for the screwdriver, and wings to allow fingers to grip and turn the cap easily.

To control the pivoting of the clamp dogs, each clamping assembly includes a clamp dog tower connected with the mounting flange. The clamp dog tower encloses the pivoting end of the clamp dog and has a slot though which the rest of the clamp dog extends. The clamp dog tower thus prohibits pivoting of the clamp dog beyond the width of the slot. The slot can be configured for any desired width, depending on the amount of pivoting required to support the component.

To provide for sufficient clamping in one embodiment of the invention, the screw has a lower threaded portion and an upper unthreaded portion. Turning the screw in one direction causes the clamp dog to rotate until the clamp dog contacts an edge of the slot of the dog tower, and then travels along the threaded portion of the screw until the clamp dog reaches a clamped position. Turning screw in the opposite direction causes the clamp dog to travel up the threaded portion of the screw until it reaches the unthreaded portion of the screw. Further turning of the screw in this opposite direction while the clamp dog is located on the unthreaded portion of the screw does not cause the clamp dog to move along the screw, but rather the clutch mechanism ensures that the clamp dog continues to be pressed against the round enclosure.

In a preferred embodiment, there are four clamping assemblies with captive hardware, arranged in two pairs located on opposite sides of the mounting flange. Other arrangements of fewer or more clamping assemblies could also be used.

To allow for the smallest possible hole to be cut in the sheet rock or ceiling tile, the clamp dog has a profile that matches a shape of the mounting flange, so that in a closed position, the clamp dog is flush with the mounting flange and does not require any further clearance to be inserted through the hole. For example with a round speaker assembly, the clamp dogs are curved to fit the rounded contour of the speaker assembly.

To distribute the clamping pressure along the sheet rock or ceiling tile, each clamp dog can have a spreader pad located on its lower surface, so that the pressure against the sheet rock or ceiling tile is not entirely localized along a narrow width of the clamp dog.

To keep the clamp dog from coming out of the dog tower through a wide slot in the dog tower, the cap can have a skirt extending around a lower portion of the cap. The skirt encloses a top edge of the clamp dog tower and prevents the screw and clamp dog from coming out of the dog tower.

To keep the clamp dog fixed in position when it contacts the cap in a raised position, the cap has a clutch system formed from springs and teeth that grip the clamp dog and prevent the clamp dog from rotating freely in that position. The springs in the cap also apply pressure to the clamp dog and force the central screw threads to re-engage the clamp dog.

To prevent the clamp dog from rotating during insertion or removal of the component from the sheetrock or ceiling tile, the cap can be serrated on an external surface and the clamp dog tower can have a vertical extension that interacts with the serrations on the cap to keep the clamp dog in a fixed position during movement of the system into and out of the aperture.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
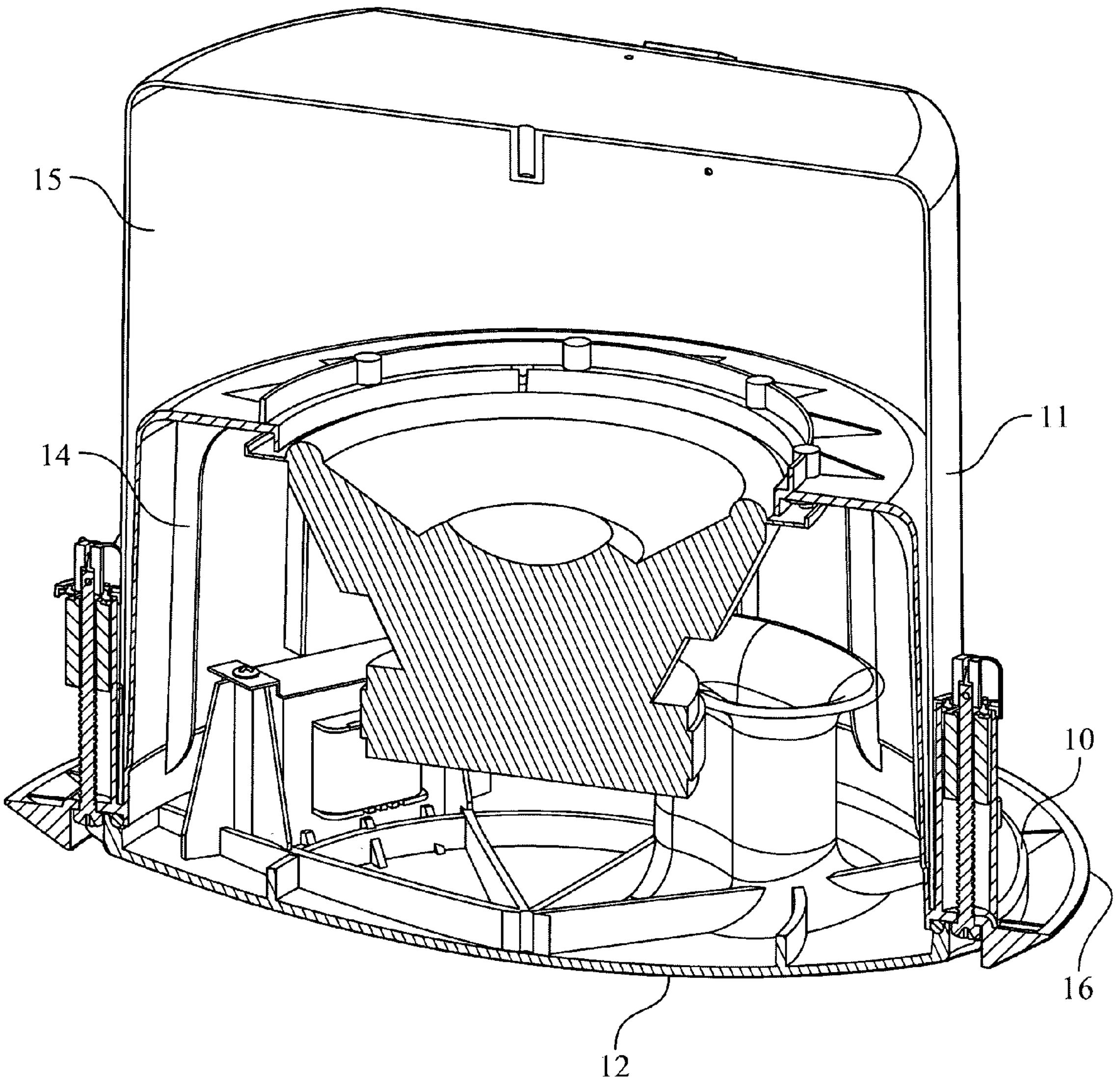
FIG. 1 shows a cross-sectional view of a speaker having the mounting system according to one embodiment of the invention.

The embodiment shown in the drawings concerns a band-pass style subwoofer, but the invention is equally useful for many other speaker types and sizes. The subwoofer assembly as shown in FIG. 1 has a unique design where one molded cylindrical part 10 forms the mounting flange 16 and one half of a chamber 14. A cylindrical metal back-can 11 encloses this part and forms a second chamber 15. A ported cover 12 completes the first chamber. Back-can 11 has an angled terminal entry with flush cover to fit tight spaces.

Figure 2:
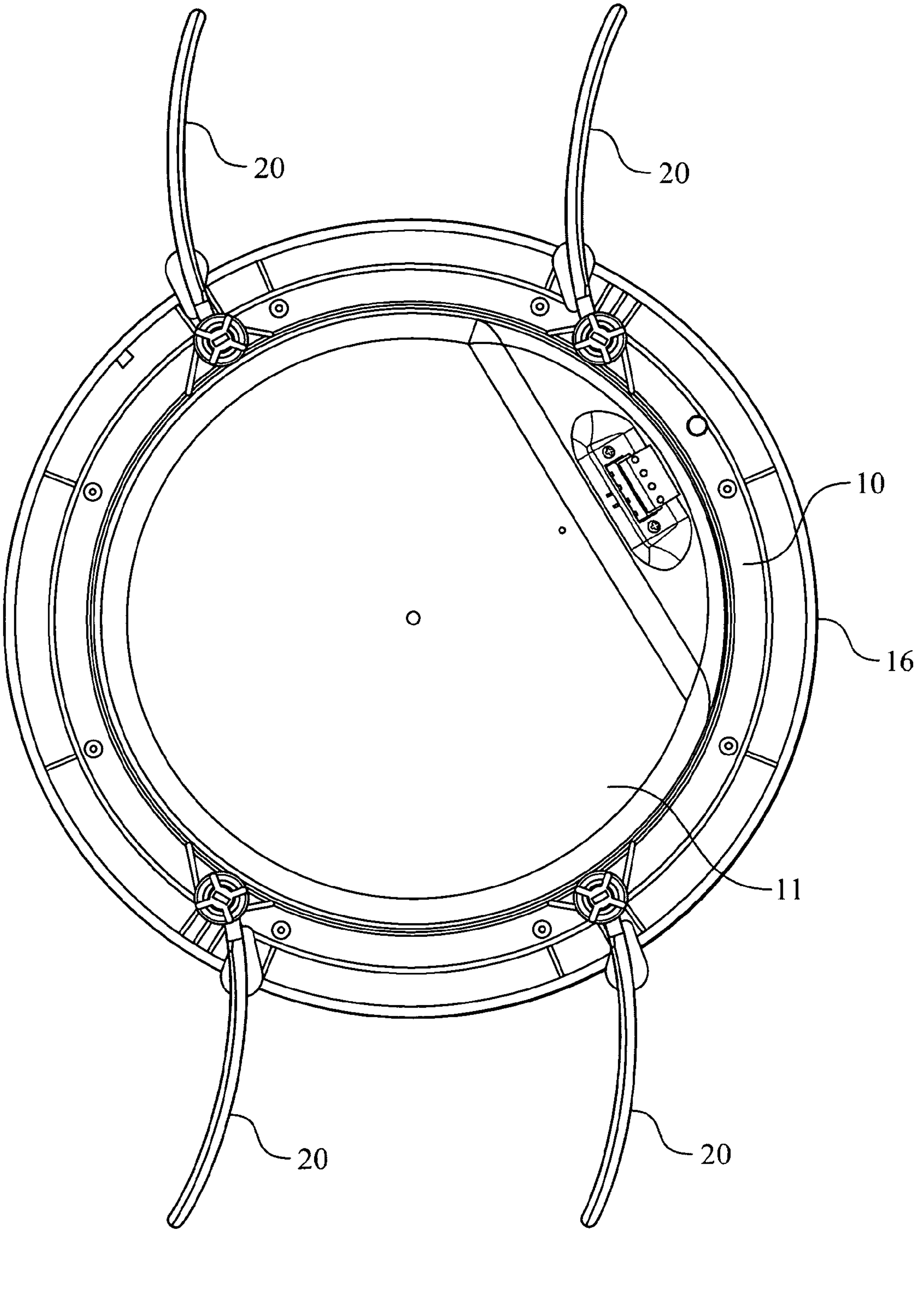
FIG. 2 shows a top view of the speaker system of FIG. 1, with the clamp dogs extended.
Figure 3:
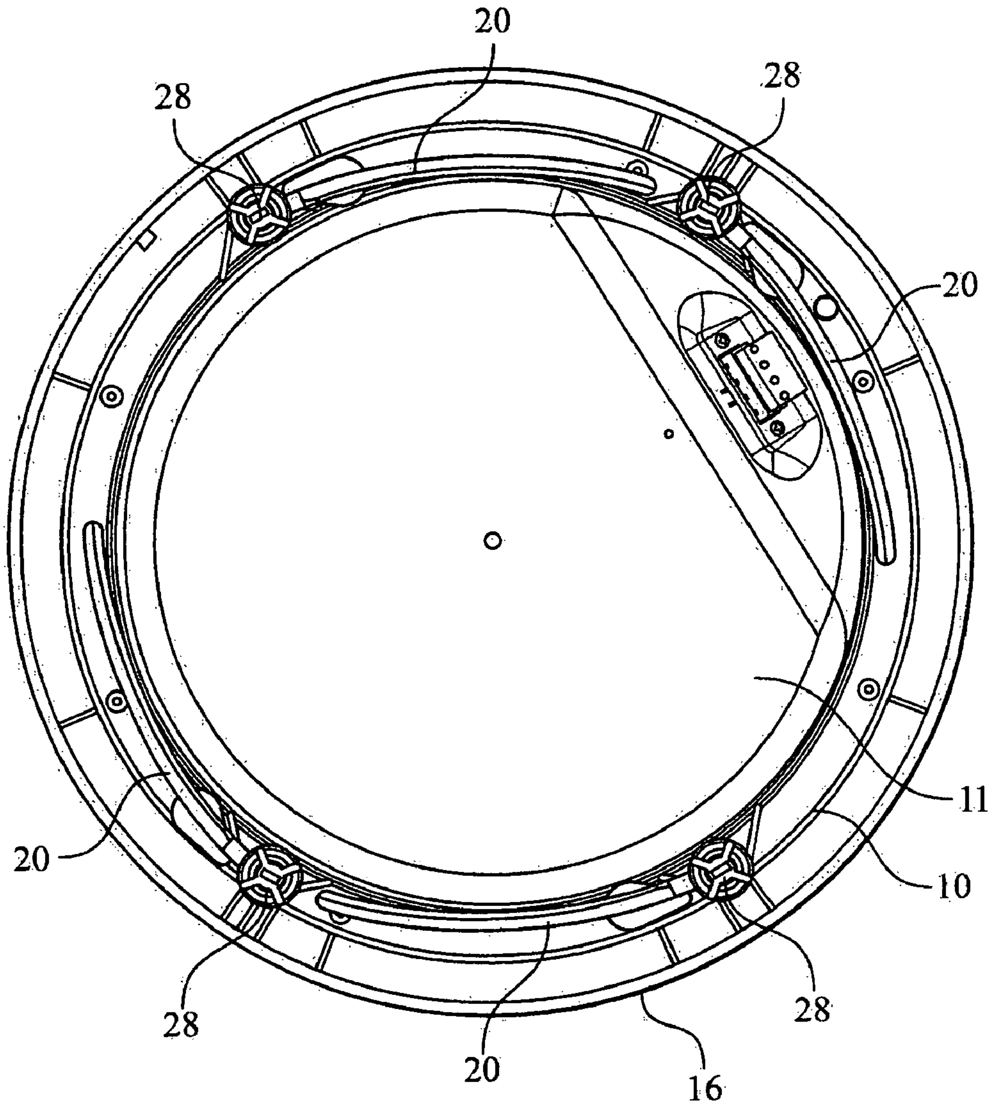
FIG. 3 shows a top view of the speaker system of FIG. 2 with the clamp dogs in a closed position.
Figure 7:
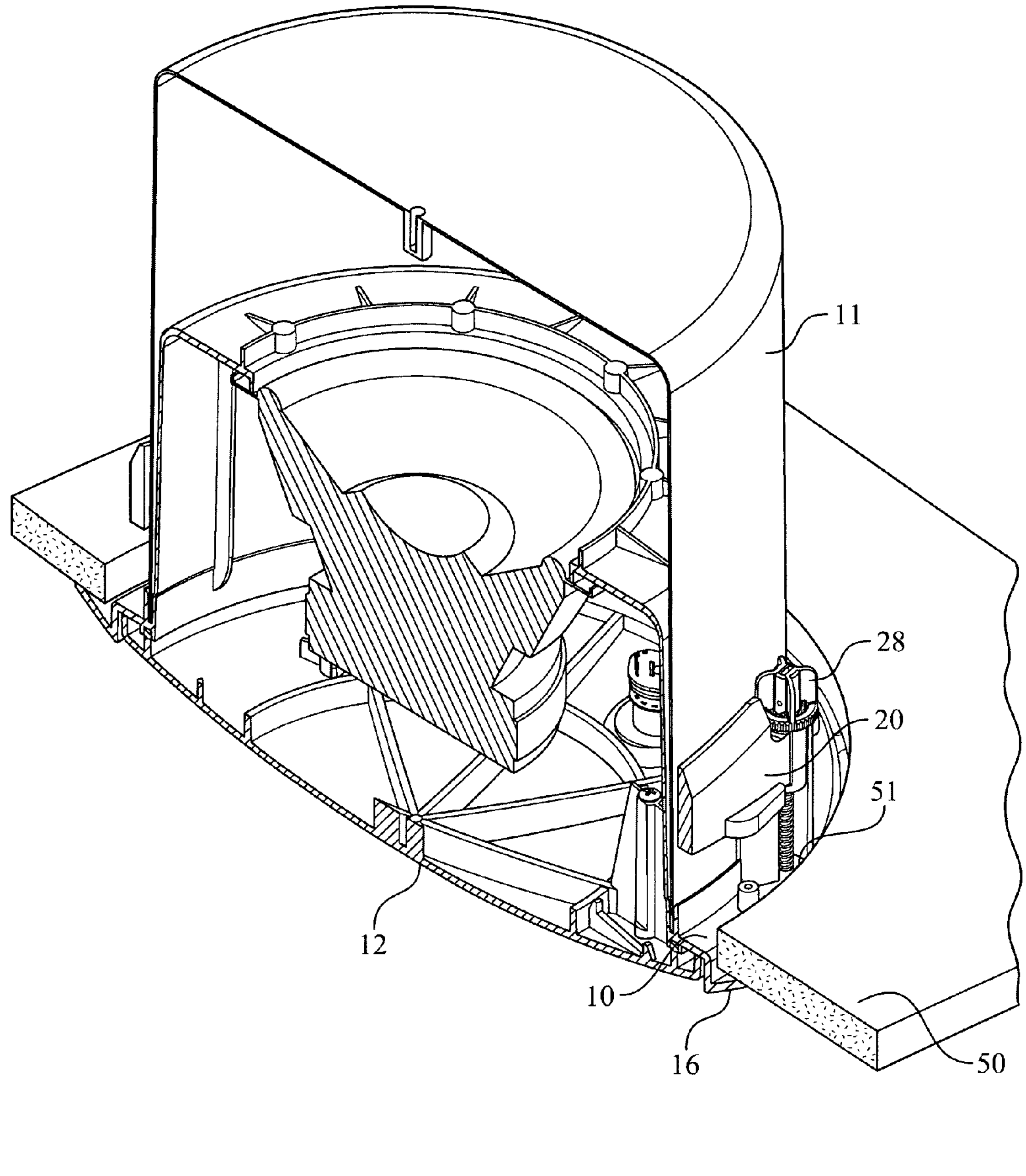
FIG. 7 shows a cross-sectional view of the speaker system inserted in a ceiling tile, prior to mounting.

To eliminate the need for a separate tile bridge, four long clamp dogs 20 as shown in FIGS. 2 and 3, are connected to mounting flange 16 of the speaker. These are curved to fit tightly to the cylindrical metal back can 11 so the product assembly can be installed through the smallest possible mounting hole 51 in a ceiling tile 50, as shown in FIG. 7. Two of these clamp dogs 20 are placed close together, forming two pairs. This keeps their length to a minimum by getting each clamp dog 20 closer to the edge of the ceiling tile. Clamp dogs 20 employ spreader pads 21 to reduce contact pressure, and a top chamfer 22 to ease passage through the mounting hole.

Figure 4:
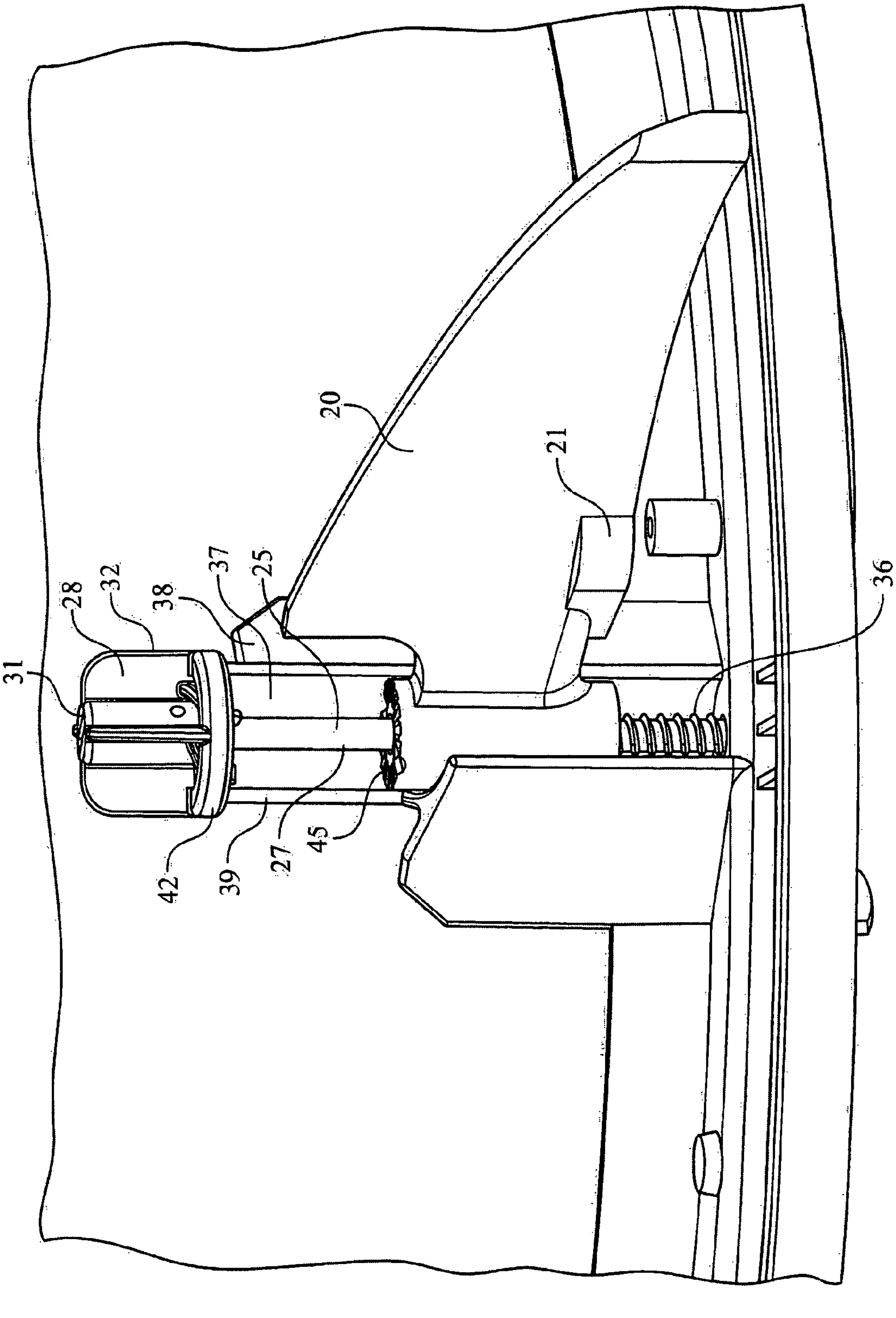
FIG. 4 shows a detail of the clamp dog assembly.
Figure 5:
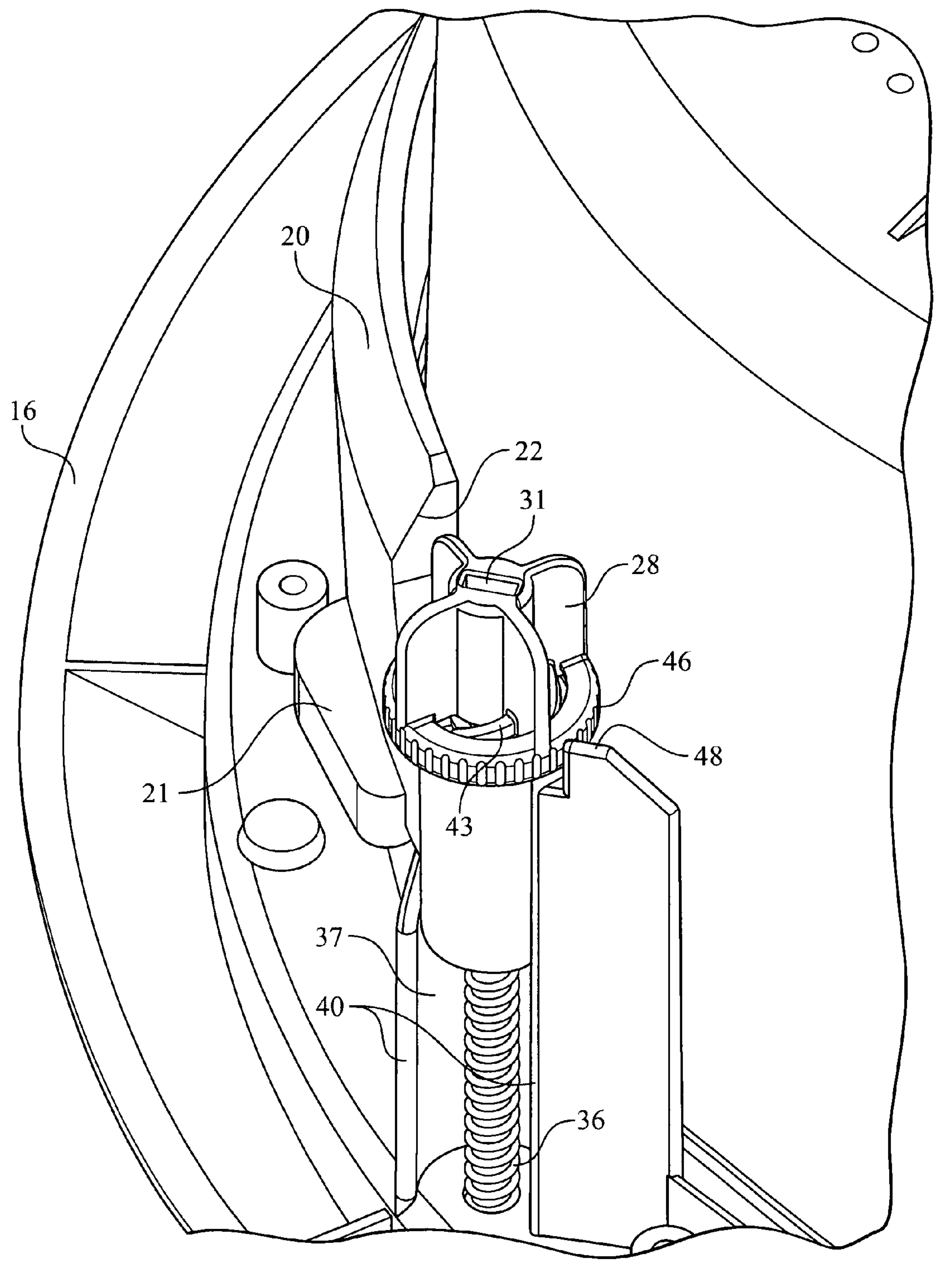
FIG. 5 shows a top view of the clamp dog assembly.

Clamp dogs 20 ride inside of cylindrical dog towers, as shown in FIG. 4. Clamp dogs 20 are driven up and down by a central screw 25 with a standard head 26 on one end for operation from the front side of the speaker, as shown in FIG. 5. The other end accepts a barbed snap-on cap 28 via a flattened portion 29 (to prevent rotation) and a notch 30 (to prevent removal). Cap 28 has a screwdriver slot 31 that can be used to turn central screw 25 from the back side of the speaker. Cap 28 also has wings 32 that allow central screw 25 to be turned by hand when necessary.

Figure 8:
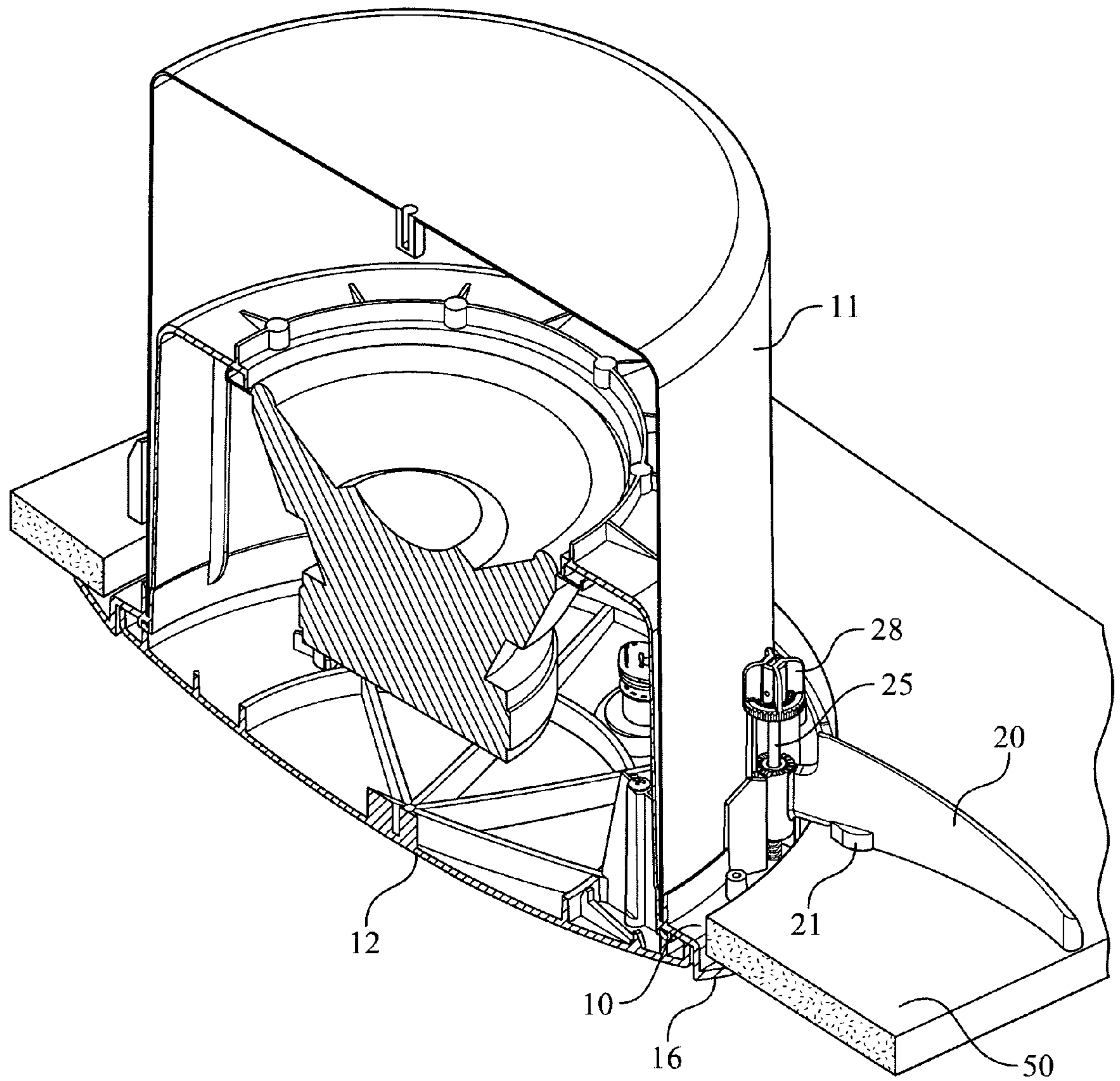
FIG. 8 shows the view of FIG. 7 with the clamp dogs extended and tightened against the ceiling tile.
Figure 9:
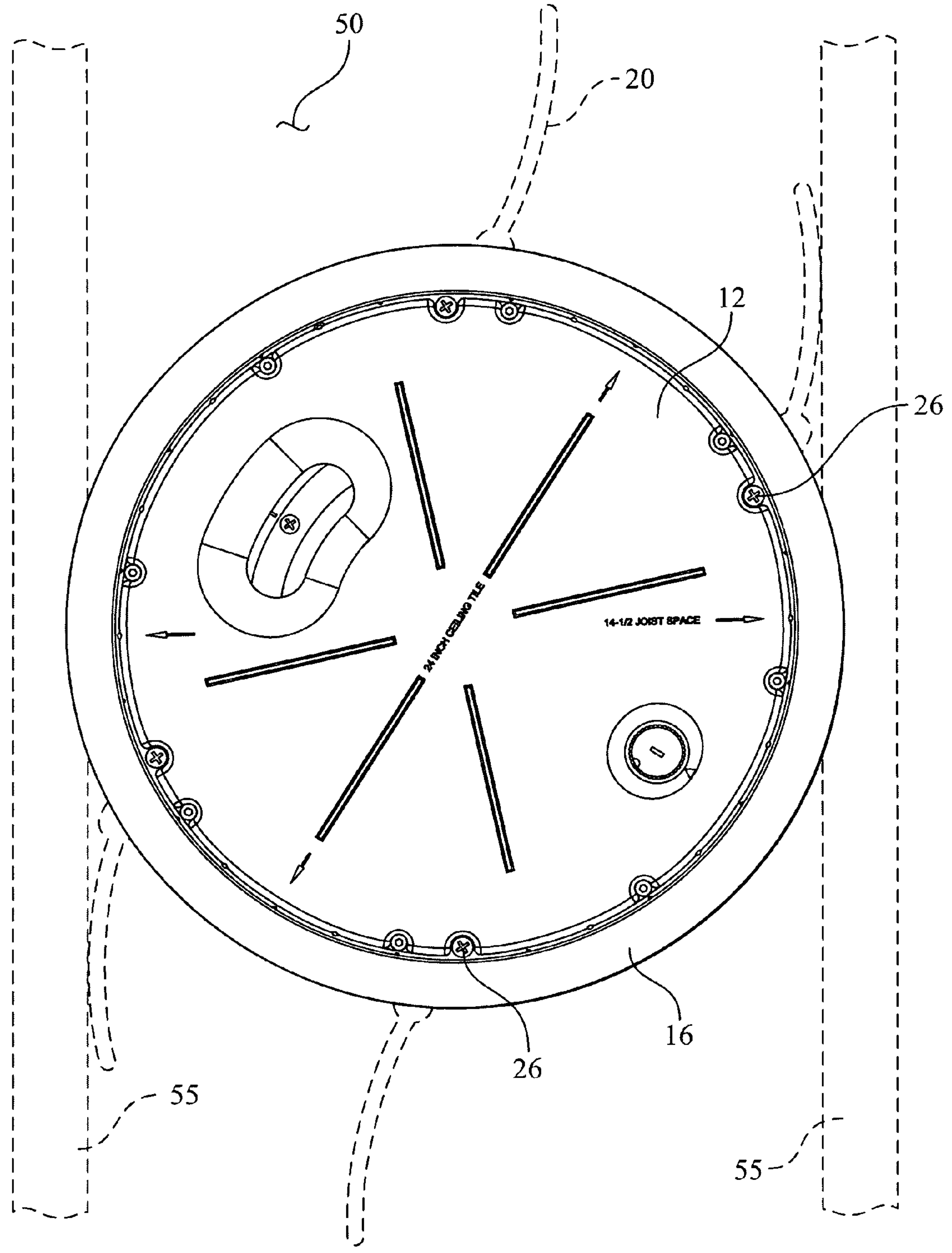
FIG. 9 shows a bottom view of the speaker system mounted in the ceiling tile.

For installation, the product assembly is inserted through a circular cut-out 51 in a ceiling tile 50, as shown in FIG. 7. Torque is applied to central screw 25 and friction at screw threads 36 rotates clamp dog 20 until it contacts dog tower 37 or other obstruction. Clamp dog 20 then travels down central screw thread 36 until it securely clamps ceiling tile 50 against mounting flange 16, as shown in FIGS. 8 and 9. Ribs 38 supporting dog tower 37 are cut on an angle to prevent clamp dog 20 from binding on top of them.

For removal, rotation of central screw 25 is reversed. Clamping pressure on ceiling tile 50 is released, and friction again rotates clamp dog 20 until it contacts dog tower 37. Clamp dog 20 then travels up central screw 25. At the top of the clamp dog's travel, a relief 39 in dog tower 37 allows clamp dog 20 to rotate tightly up against cylindrical metal back-can 11. The assembly can then be removed through cut-out 51.

Large slots 40 in dog towers 37 give clamp dogs 20 a wide operating angle. Clamp dogs 20 do not have to extend fully to function. This allows clamp dog 20 to work properly even when it hits the side of a narrow cavity, such as 16" OC framing. Clamp dog 20 can still travel down dog towers 37 to clamp onto ceiling 50. The disadvantage of a wide slot 40 in dog tower 37 is the ability of clamp dog 20 to pop out of dog tower 37. A skirt 42 on cap 28 overhangs dog tower 37 and keeps central screw 25 concentric, preventing clamp dog 20 from exiting through the slot 40 in dog tower 37.

Figure 6:
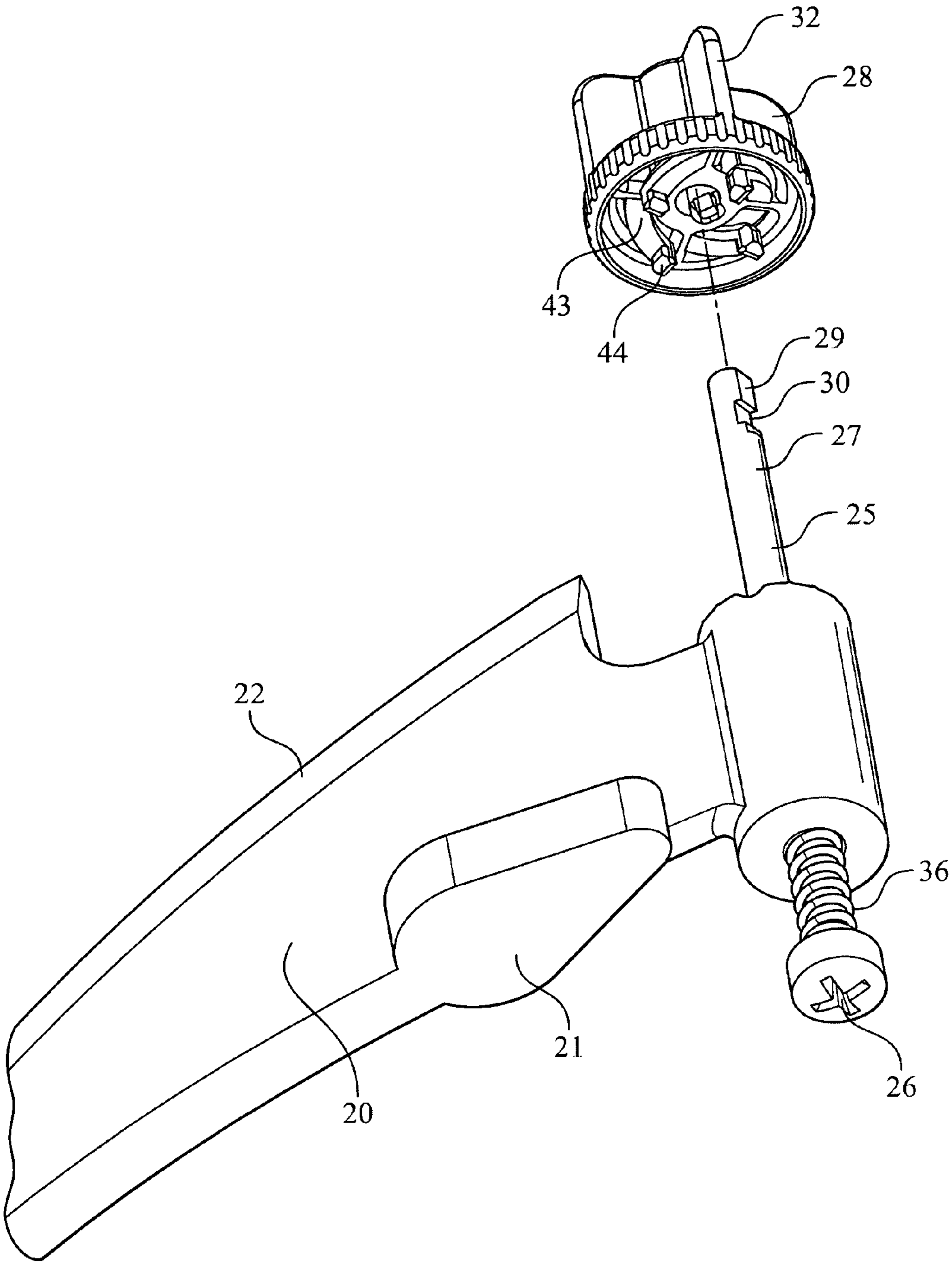
FIG. 6 shows an exploded view of the clamp dog, central screw and cap.

Central screw 25 has an unthreaded portion 27. When fully retracted, clamp dog 20 disengages threads 36 and screw 25 can continue to rotate without consequence, but this eliminates friction at threads 36 to rotate clamp dog 20. At this point, central screw 25 forces clamp dog 20 and cap 28 together, as shown in FIG. 7 and FIG. 5. Integral springs 43 and teeth 44 in the cap 28 (shown in FIG. 6) form a clutch to ensure that clamp dog 20 continues to be pressed against metal back-can 11. Grooves and ridges 45 on top of dog 20 maximize clutch performance. Serrations 46 on cap 28 and an extension 48 on dog tower 37 as shown in FIG. 5 provide detents to keep clamp dog 20 in position during removal from mounting hole 51. When rotation of the mechanism is reversed in the fully retracted position, springs 43 in cap 28 apply pressure to clamp dog 20 and force central screw threads 36 to re-engage clamp dog 20. Friction between threads 36 and clamp dog 20 is restored, providing normal clamp dog travel and operation up and down central screw 25.

As shown in FIG. 9, the assembly can be installed in a variety of differently-sized structures, as clamp dogs 20 do not need to extend fully to work. In this instance, two clamp dogs run into obstructions (beams 55) and are not able to extend fully. However, the clamp dogs are still able to operate and the assembly is still fully supported on ceiling 50 by clamp dogs 20.

Accordingly, while only a few embodiments of the present invention have been shown and described, it is obvious that many changes and modifications may be made thereunto without departing from the spirit and scope of the invention.

What is claimed is:

1. A system for mounting a component in an aperture in a ceiling grid, comprising;

a mounting flange surrounding the component, said mounting flange having a front surface and a rear surface; and at least two clamping assemblies attached to the mounting flange and located adjacent a rear surface of the mounting flange, each clamping assembly comprising:

an elongated clamp dog; and a pivoting system for pivoting the clamp dog around an axis, said pivoting system being operable from both the front surface and the rear surface of the mounting flange;

wherein said pivoting system is pivoted between a retracted and extended position, such that in said retracted position, the clamp dog is located within a radius of the mounting flange, and in said extended position, the clamp dog extends beyond a radius of the mounting flange to support the component on the ceiling grid, wherein said pivoting system comprises a screw extending through said clamp dog, said screw having a screw head accessible from the front surface of the mounting flange, and having a cap mounted on an opposite end of the screw, such that said screw can be turned from both surfaces of the mounting flange to pivot the clamp dog;

wherein each clamping assembly further comprises a clamp dog tower connected with the mounting flange, said clamp dog tower enclosing the end of the clamp dog and having a slot though which the clamp dog extends, said clamp dog tower prohibiting pivoting of the clamp dog beyond a width of the slot; and wherein the screw has a lower threaded portion and an upper unthreaded portion, such that turning the screw in one direction causes the clamp dog to rotate until the clamp dog contacts an edge of the slot of the dog tower, and then travel along the threaded portion of the screw until the clamp dog reaches a clamped position, and turning screw in an opposite direction causes the clamp dog to travel up the threaded portion of the screw until it reaches the unthreaded portion of the screw, and wherein further turning of the screw in said opposite direction while the clamp dog is located on the unthreaded portion of the screw does not cause the clamp dog to move along the screw.

2. The system according to claim 1, wherein the cap has a slot for accommodating a screwdriver, and wings to allow for manual turning of the screw.

3. The system according to claim 1, wherein there are four clamping assemblies, said clamping assemblies being arranged in two pairs located on opposite sides of the mounting flange.

4. The system according to claim 1, wherein the clamp dog has a profile that matches a shape of the component, so that in a closed position, the clamp dog is flush with the component.

5. The system according to claim 1, wherein the clamp dog has at least one spreader pad located on a lower surface thereof, said spreader pad resting on the supporting surface to distribute clamping pressure of the clamp dog when the clamp dog is in a clamped position.

6. A system for mounting a component in an aperture in a ceiling grid, comprising;

a mounting flange surrounding the component, said mounting flange having a front surface and a rear surface; and at least two clamping assemblies attached to the mounting flange and located adjacent a rear surface of the mounting flange, each clamping assembly comprising:

an elongated clamp dog; and a pivoting system for pivoting the clamp dog around an axis, said pivoting system being operable from both the front surface and the rear surface of the mounting flange;

wherein said pivoting system is pivoted between a retracted and extended position, such that in said retracted position, the clamp dog is located within a radius of the mounting flange, and in said extended position, the clamp dog extends beyond a radius of the mounting flange to support the component on the ceiling grid, wherein said pivoting system comprises a screw extending through said clamp dog, said screw having a screw head accessible from the front surface of the mounting flange, and having a cap mounted on an opposite end of the screw, such that said screw can be turned from both surfaces of the mounting flange to pivot the clamp dog;

wherein each clamping assembly further comprises a clamp dog tower connected with the mounting flange, said clamp dog tower enclosing the end of the clamp dog and having a slot though which the clamp dog extends, said clamp dog tower prohibiting pivoting of the clamp dog beyond a width of the slot; and wherein the cap has a skirt extending around a lower portion of the cap, said skirt enclosing a top edge of the clamp dog tower and preventing the screw and clamp dog from coming out of the dog tower.

7. A system for mounting a component in an aperture in a ceiling grid, comprising;

a mounting flange surrounding the component, said mounting flange having a front surface and a rear surface; and at least two clamping assemblies attached to the mounting flange and located adjacent a rear surface of the mounting flange, each clamping assembly comprising:

an elongated clamp dog; and a pivoting system for pivoting the clamp dog around an axis, said pivoting system being operable from both the front surface and the rear surface of the mounting flange;

wherein said pivoting system is pivoted between a retracted and extended position, such that in said retracted position, the clamp dog is located within a radius of the mounting flange, and in said extended position, the clamp dog extends beyond a radius of the mounting flange to support the component on the ceiling grid, wherein said pivoting system comprises a screw extending through said clamp dog, said screw having a screw head accessible from the front surface of the mounting flange, and having a cap mounted on an opposite end of the screw, such that said screw can be turned from both surfaces of the mounting flange to pivot the clamp dog;

wherein each clamping assembly further comprises a clamp dog tower connected with the mounting flange, said clamp dog tower enclosing the end of the clamp dog and having a slot though which the clamp dog extends, said clamp dog tower prohibiting pivoting of the clamp dog beyond a width of the slot; and wherein the cap has a clutch system formed from springs and teeth that grip the clamp dog and prevents the clamp dog from rotating freely when the clamp dog is in a raised position.

8. The system according to claim 7, wherein said clamp dog has grooves and ridges on a top surface thereof adjacent the screw, said grooves and ridges contacting the teeth of the cap to prevent the clamp dog from rotating freely.

9. A system for mounting a component in an aperture in a ceiling grid, comprising;

a mounting flange surrounding the component, said mounting flange having a front surface and a rear surface; and at least two clamping assemblies attached to the mounting flange and located adjacent a rear surface of the mounting flange, each clamping assembly comprising:

an elongated clamp dog; and a pivoting system for pivoting the clamp dog around an axis, said pivoting system being operable from both the front surface and the rear surface of the mounting flange;

wherein said pivoting system is pivoted between a retracted and extended position, such that in said retracted position, the clamp dog is located within a radius of the mounting flange, and in said extended position, the clamp dog extends beyond a radius of the mounting flange to support the component on the ceiling grid, wherein said pivoting system comprises a screw extending through said clamp dog, said screw having a screw head accessible from the front surface of the mounting flange, and having a cap mounted on an opposite end of the screw, such that said screw can be turned from both surfaces of the mounting flange to pivot the clamp dog;

wherein each clamping assembly further comprises a clamp dog tower connected with the mounting flange, said clamp dog tower enclosing the end of the clamp dog and having a slot though which the clamp dog extends, said clamp dog tower prohibiting pivoting of the clamp dog beyond a width of the slot; and wherein the cap is serrated on an external surface thereof, and wherein the clamp dog tower has a vertical extension that interacts with the serrations on the cap to keep the clamp dog in a fixed position during movement of the system into and out of the aperture.

* * * * *